(12) United States Patent
Weiss et al.

(10) Patent No.: US 7,704,079 B2
(45) Date of Patent: Apr. 27, 2010

(54) T-SHAPED SHIELDED BUS CONNECTOR

(75) Inventors: Dominik Weiss, Aerzen (DE); Stephan Grewe, Lemgo (DE); Johann Derksen, Brakel (DE); Winfried Thuer, Steinheim (DE)

(73) Assignee: Phoenix Contact GmbH & Co. KG (DE)

( * ) Notice: Subject to any disclaimer, the term of this patent is extended or adjusted under 35 U.S.C. 154(b) by 26 days.

(21) Appl. No.: 12/245,137

(22) Filed: Oct. 3, 2008

(65) Prior Publication Data

US 2009/0104814 A1 Apr. 23, 2009

(30) Foreign Application Priority Data

Oct. 23, 2007 (DE) .................... 10 2007 050 943.1

(51) Int. Cl.
*H01R 12/00* (2006.01)

(52) U.S. Cl. .................... 439/65; 439/79; 439/607.4

(58) Field of Classification Search ............. 439/65–69, 439/79, 607.31–607.4, 715
See application file for complete search history.

(56) References Cited

U.S. PATENT DOCUMENTS 5,387,127 A 2/1995 Wang
6,986,682 B1 * 1/2006 Jeon ...................... 439/607.07
7,278,856 B2 * 10/2007 Minich .......................... 439/65

FOREIGN PATENT DOCUMENTS

| DE | 3740290 A1 | 1/1989 |
| DE | 4331143 C1 | 2/1995 |
| DE | 19610559 A1 | 9/1997 |
| DE | 19838493 C1 | 11/2000 |

OTHER PUBLICATIONS

J. Schuster, "DE Patent Application No. 10 2007 050 943.1-34 Office Action", Sep. 25, 2008, Published in: DE.

* cited by examiner

*Primary Examiner*—Khiem Nguyen
(74) *Attorney, Agent, or Firm*—DeMont & Breyer, LLC

(57) ABSTRACT

The invention describes a T-shaped bus connector comprising a holding device for mechanically retaining the T-shaped bus connector on a mounting device on which the T-shaped bus connector is to be arranged, and further comprises a first and a second connecting unit for respectively producing an electrical connection to a complementary connecting unit of a device arranged adjacent to the bus connector, wherein the first and second connecting units face in substantially opposing directions and are constructed complementarily to one another, as well as a third connecting unit, oriented substantially perpendicular to the first and second connecting units, for producing an electrical connection to a connecting unit, complementary to the third connecting unit, of an electrical or electronic module, wherein data and/or power bus lines are run between all three connecting units, and all three connecting units are covered at least in part with a shielding material.

12 Claims, 9 Drawing Sheets

T-SHAPED SHIELDED BUS CONNECTOR

The invention relates to a T-shaped bus connector that is to be arranged on a mounting device and comprises a holding device for mechanical retention of the connector on the mounting device.

Electronic modules for controlling processes are known, for example, from DE 37 40 290 C2, which can be connected via rear-side plug connector elements to plug connector elements of bus socket modules that can be mounted in a standard-profile mounting rail and have line sections of a bus that can be connected by means of male multipoint connectors and female multipoint connectors to line sections of a bus on bus-socket modules adjacent at either side. The male multipoint connectors and female multipoint connectors provided there, however, are each arranged on the bus socket module facing in the direction of the standard profile mounting rail or in the opposite direction, so that the bus socket modules must be mounted and interconnected from the front side of the standard profile mounting rail. The lines of the bus are shielded against electromagnetic interference only to a certain extent by the standard profile mounting rail.

In addition, bus connector or bus socket modules that connect adjacent modules to one another are known, for example, from DE 198 05 065 A1. A substantial disadvantage in this solution is that the modules themselves serve as bus board wiring, and that both the bus signals and the supply voltage are interrupted whenever a module is removed.

U-shaped bus connectors are additionally known, from EP 0 527 247 B1 for instance, in which the bus connectors are arranged on the modules in such a manner that adjacent modules are necessarily electroconductively connected to one another in the assembly of the modules. In the configuration disclosed there as well, both the data line and the voltage supply are interrupted whenever a module is removed. Special shielding cannot be inferred from the two above-mentioned publications.

Modules that are connected by means of conductors in the form of rails are also known, as in, for example, DE 195 15 538 or DE 195 24 123.

Finally, a T-shaped bus connector that can serve as a bus socket module for one or more modules is known according to EP 0 896 504 B1, for instance. This bus connector has three plug connectors which, however, are directly connected to one another via metal contacts.

A particular disadvantage in the known bus socket modules or bus connectors is that future challenges can frequently no longer be mastered with these solutions. First, the data will become faster and faster in the future and the high-frequency component will therefore become larger and larger, from which a greater noise emission will result. Second, the signal levels will become lower and lower at the same time and interference in from the outside will consequently become relatively greater and greater. Furthermore, the line drivers that are suitable for higher data rates react more sensitively to common-mode interference.

One problem of the invention is consequently to refine a bus connector or bus socket module of the present class in such a manner that the electromagnetic compatibility is substantially improved. Additional problems are to increase the possibility and flexibility for using such bus connectors.

Solutions according to the invention are the subject matter of the appended claims, wherein advantageous and/or preferred embodiments and refinements are the subject matter of the dependent claims.

The invention consequently provides a T-shaped bus connector comprising a holding device for mechanically retaining the T-shaped bus connector on a mounting device on which the T-shaped bus connector is to be arranged, and further comprises a first and a second connecting unit for respectively producing an electrical connection to a complementary connecting unit of a device arranged adjacent to the bus connector, wherein the first and second connecting units face in substantially opposing directions and are constructed complementarily to one another, as well as third connecting unit, oriented substantially perpendicular to the first and second connecting unit, for producing an electrical connection to a connecting unit, complementary to the third connecting unit, of an electrical or electronic module, wherein data and/or power bus lines are run between all three connecting units, and all three connecting units of the T-shaped bus connector are covered at least in part with a shielding material which, in case of a connection of each connecting unit to a respective complementarily formed connecting unit, contacts shielding material partially covering this complementarily formed connecting unit.

In this way, a number of T-shaped bus connectors, also referred to as bus socket modules below, can be concatenated in the simplest manner into a backplane bus that connects electrical or electronic modules to the bus system via the individual T-shaped bus connectors in an extremely advantageous manner, and is additionally shielded substantially on all sides.

Further characteristics and advantages of the invention follow from the description below for the sake of example of an embodiment of the invention, with reference to the appended drawings. In the drawings.

Reference will be made below initially to FIGS. 1-5 and 7-9, which show various embodiments of T-shaped bus connectors according to the invention, as well as exemplary arrangements of several T-shaped bus connectors, each populated with an electrical or electronic module.

One bus socket module or bus connector 100 is provided for each module 200. The electrical or electronic modules 200 are only suggested in the figures, and can comprise, for example, connected sensors or actuators, but will not be discussed further.

Each bus connector 100 has a holding device for mechanical retention of the bus connector on a mounting device 300, on which the bus connector is to be arranged in order to be put into operation. In the examples shown in the figures, the mounting device 300 is a mounting rail, onto which the bus connectors according to FIGS. 1, 4, 5 and 9 are snapped in order to be put into operation and on which mounting rail 300 they can expediently be displaced for alignment with adjacent bus connectors. For these purposes, two holding arms with catch hooks 101 arranged on either side of the longitudinal axis (reference symbol A1 in FIG. 1) of mounting rail 300, that reach around the mounting rail and allow the displacement of bus connector 100 on, and easy detachment of bus connector 100 from, the mounting rails are provided in FIG. 1. Depending on the specific configuration, two catch hooks or other retaining devices can also suffice or be provided for secure retention of a bus connector of the invention on a mounting device. Except for FIG. 1, the holding devices are not shown for reasons of clarity.

Every bus connector 100 according to the invention is constructed as a T-shaped bus connector or T-shaped bus-socket module. The T-shaped structure results from the fact that each bus connector has a first and a second bus connecting unit 102, 103, respectively, that face in opposite directions, expediently facing along the longitudinal axis of the mounting rail, if a mounting rail 300 is used, and are formed complementarily to one another, as well as a third connecting unit 104 oriented substantially perpendicular to the first and second connecting units, which faces in a direction away from the mounting device in the installed state of a bus connector.

Figure 4:
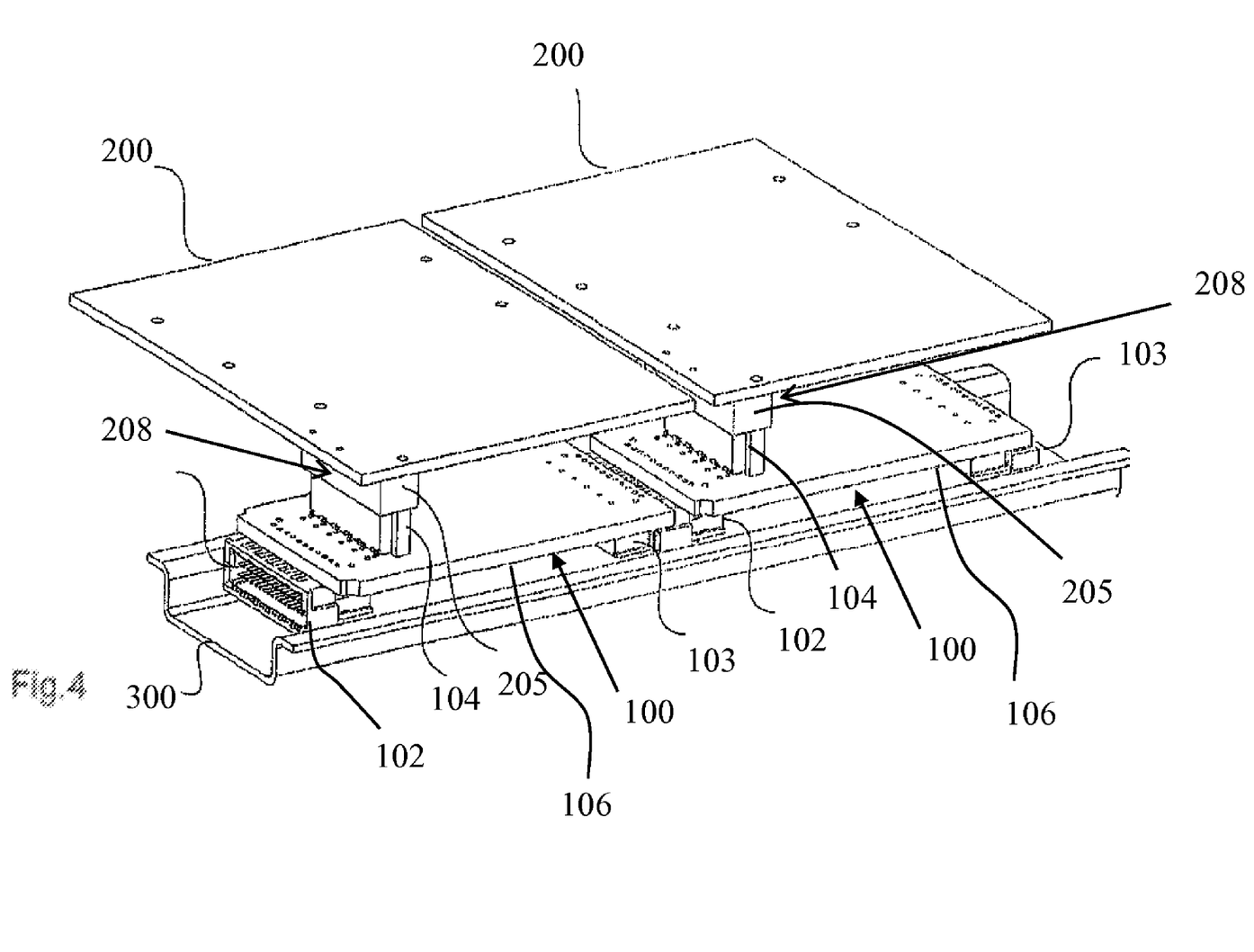
Figure 5:
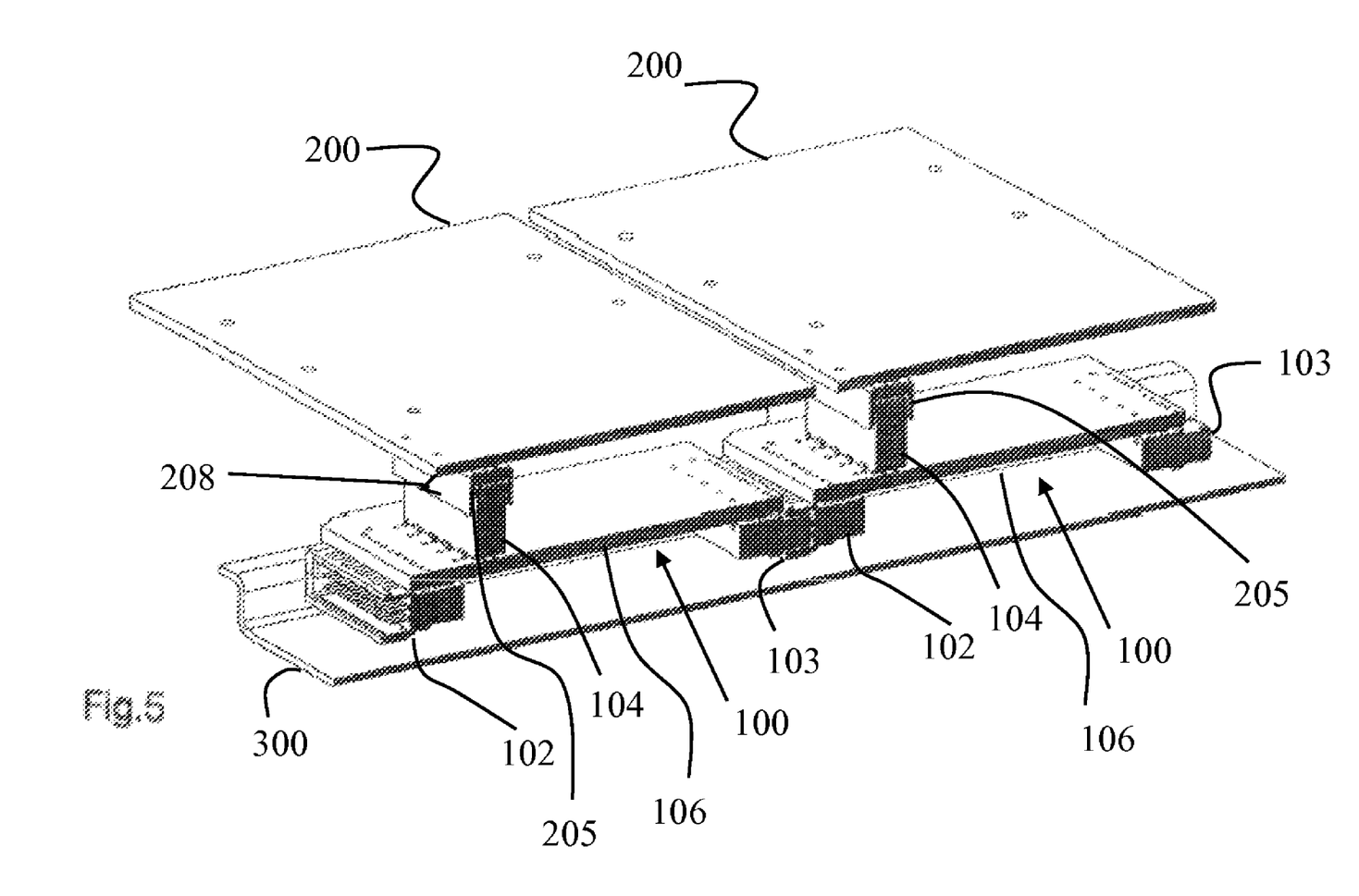
Figure 9:
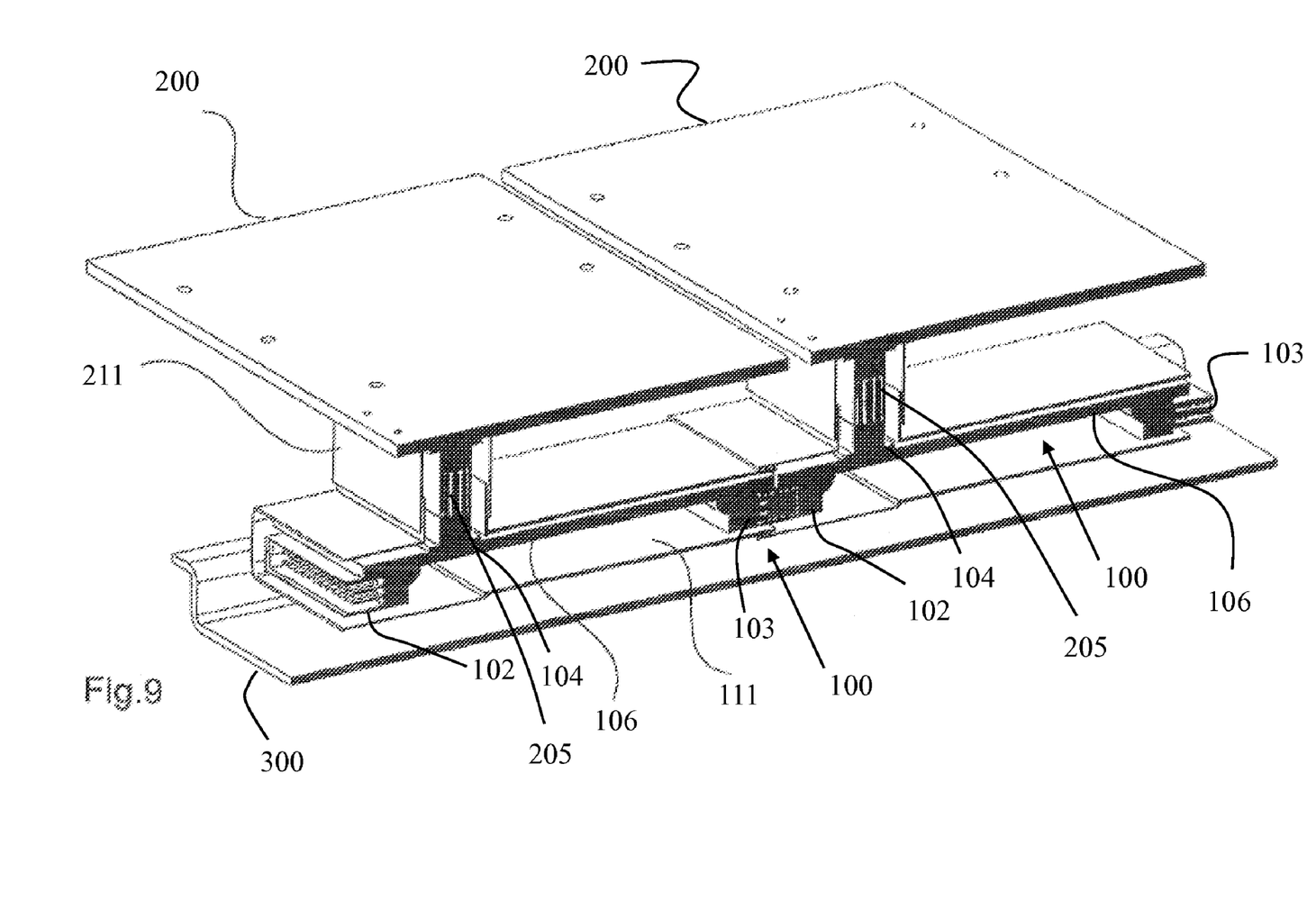

The first and second connecting units 102 and 103 serve to produce a connection to a respective complementary connecting unit of a device arranged adjacent to the bus connector, and thus enable in a simple manner the concatenation of a plurality of T-shaped bus connectors, as seen in FIGS. 4, 5 and 9. Electrical connection to a respective connecting unit 205, complementary to the third connecting unit 104, of an electrical or electronic module 200 is enabled via the third connecting unit 104. As is visible in FIGS. 4, 5 and 9, a bus socket module 100 is situated underneath each module 200. Since the connecting units 104 face in a direction away from the mounting device in the installed state of a bus connector, and thus in the direction of the underside of the module, the complementary connecting units 205 are formed on the underside of the modules.

In the embodiments illustrated in the figures, all the connecting units 102, 103, 104 and 205 have a substantially rectangular basic shape, wherein the larger outside surfaces extend in each case along the transverse axis A2 (FIG. 1) of mounting rail 300, and connecting units 102 and 205 each have a male multipoint connector, and the respective complementarily shaped connecting units 103 and 104 have a female multipoint connector that is complementary to the male multipoint connector and can be plugged together with it.

All three connecting strips 102, 103 and 104 of a bus connector 100 are preferably held in position via a circuit board 106, which additionally contains data and power bus lines that are run application-specifically between the connecting strips 102, 103 and 104, and provide the transmission of data and/or power signals on these lines after a connection has been produced between two complementary connecting units.

Figure 6A:
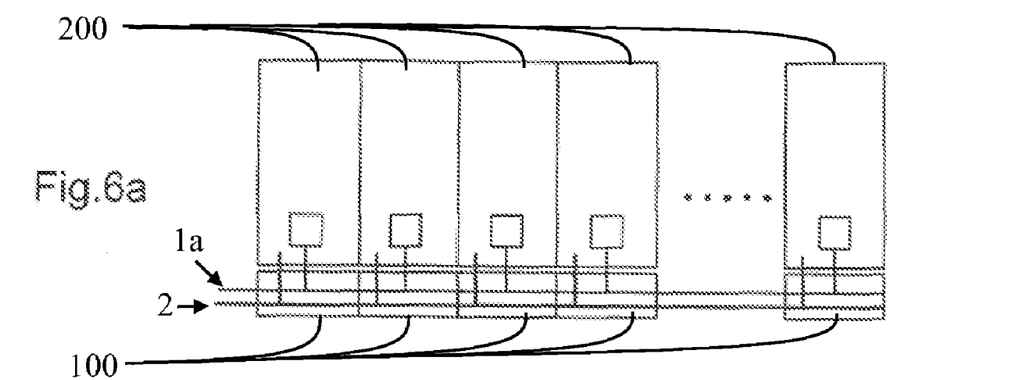
Figure 6B:
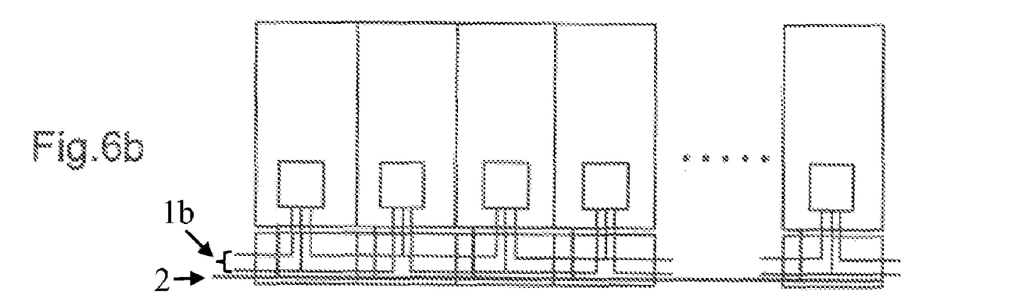
Figure 6C:
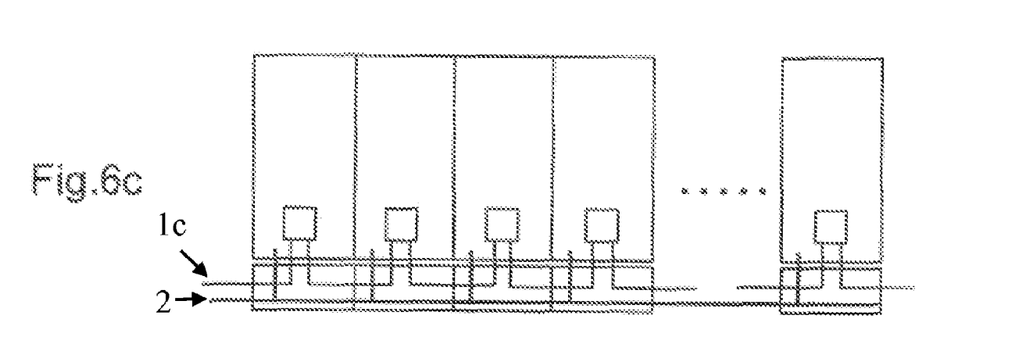
Figure 6D:
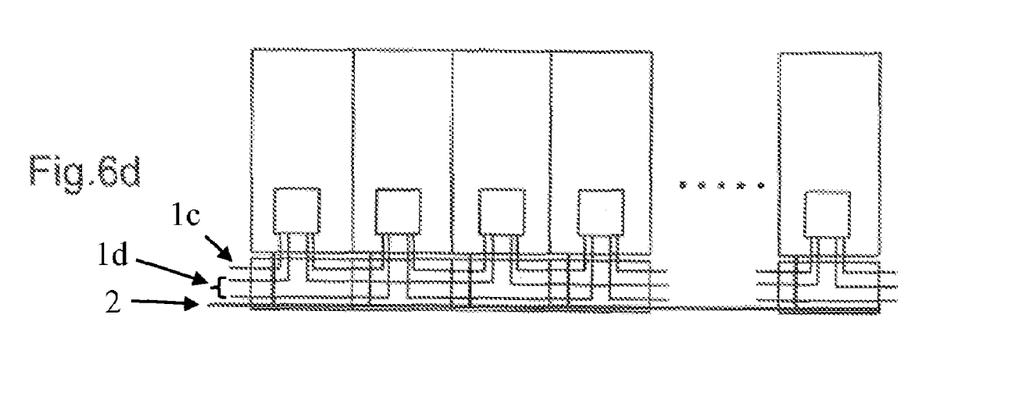

FIGS. 6a-6d show different examples of preferred bus line layouts between an arrangement of T-shaped bus connectors 100 or bus socket modules according to the invention, each populated with a module 200. Depending on the specific installed circuit board, a common supply voltage for all modules, or sensors and actuators connected thereto, for example, as well as the associated ground potential, can thus be carried in the bus socket module, as shown in FIGS. 6a-6d by the line layout labeled with the reference number 2. In addition, the required data signals can be carried differently on an application specific base via appropriately adapted bus line structures as shown for the sake of example in FIGS. 6a-6d by the line layouts labeled with the reference numbers 1a-1d. Thus, the line layout 1a according to FIG. 6a represents a line layout according to which the data signals are always present on a common bus at all three connecting units, and thus all modules are connected via this line layout. According to the two line layouts 1b of FIG. 6b, the data signals carried thereby are each present only at the third connecting units of respective groups of three directly concatenated bus connectors and the modules connected to them, so that respective groups of modules are connected to one another via a common line layout. According to the line layout 1c of FIG. 6c, only the third connecting units of two directly concatenated bus connectors are connected to one another in a type of point-to-point connection, so that the data signals carried over them connect two respective modules in the form of a "daisy chain." According to the combined conductor layout 1c and the two line layouts 1d according to FIG. 6d, two respective modules are again connected to one another in the form of a "daisy chain" via the line layout 1c, and two respective defined modules are bridged by means of the two line layouts 1d.

The preferred use of circuit boards with application-specific data and power bus lines between the first, second and third connecting units 102, 103, and 104 formed therein or thereon thus enables an electrical connection of modules 100 to the bus system via the bus socket modules that permits an exchange of modules during operation without interrupting the data connection. The data signal connections provided by means of the lines can be implemented as respective separated transmission and reception connections or as common bidirectional connections.

With the above-described connecting units, their positioning and their line connections expediently provided using the circuit boards, the connecting units 205 of the electronic or electrical module no longer need to serve as bus board wiring, and the individual modules no longer need be alternately connected to one another, so that the bus socket modules according to the invention can be used extremely flexibly.

Figure 1:
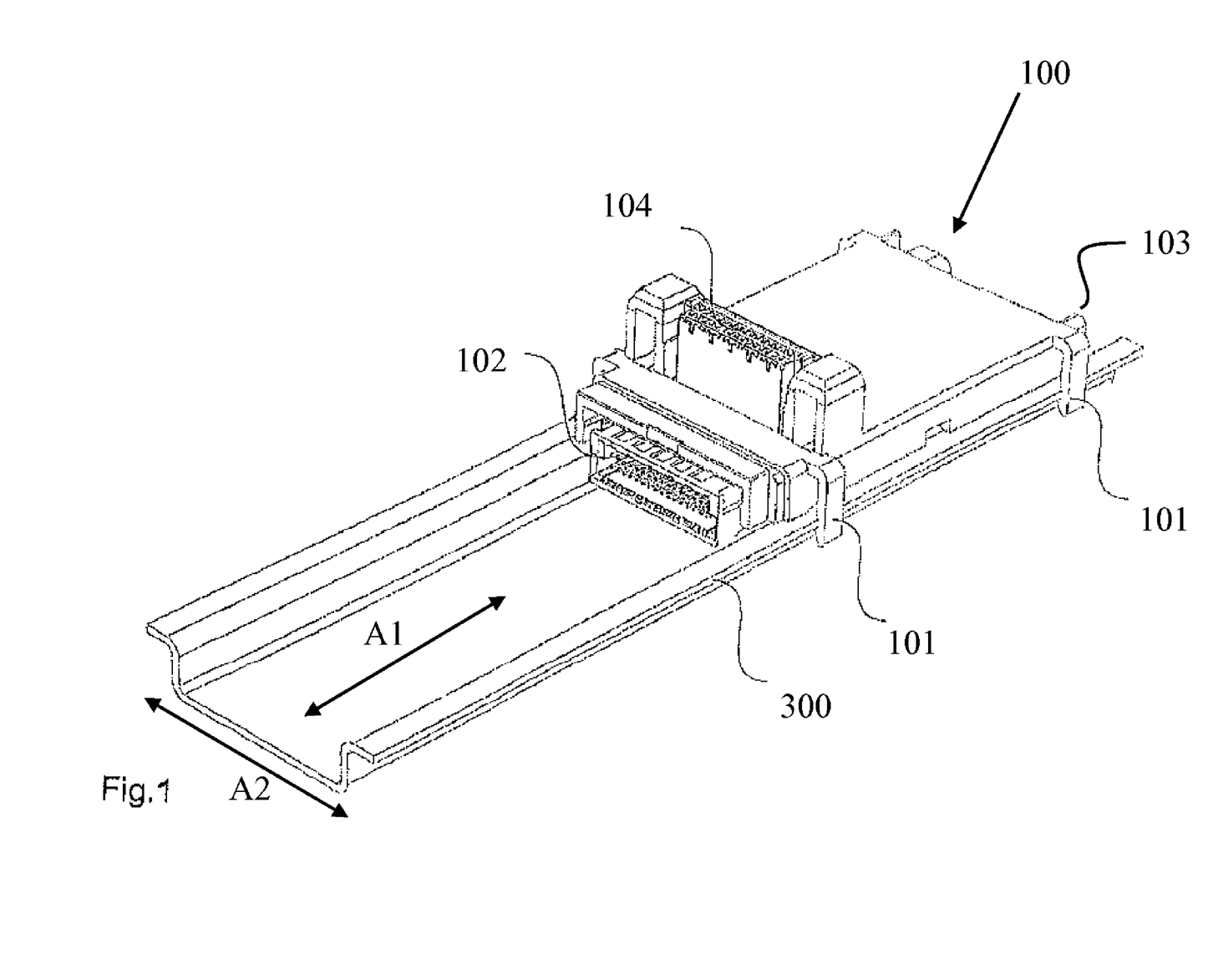
FIG. 1 shows a schematized first embodiment of a T-shaped bus connector according to the invention retained on a mounting rail, FIG. 2 a schematized second embodiment to that in FIG. 1 of a T-shaped bus connector according to the invention, FIG. 3 a schematized longitudinal section through the embodiment according to FIG. 2, FIG. 4 a schematized arrangement of two T-shaped bus connectors according to FIG. 2, each populated with a module, FIG. 5 a schematized longitudinal section through the arrangement according to FIG. 4, FIG. 6a a schematized first example of a bus line layout between an arrangement of T-shaped bus connectors according to the invention, each populated with a module, FIG. 6b a schematized second example of a bus line layout between an arrangement of T-shaped bus connectors according to the invention, each populated with a module, FIG. 6c a schematized third example of a bus line layout between an arrangement of T-shaped bus connectors according to the invention, each populated with a module, FIG. 6d a schematized fourth example of a bus line layout between an arrangement of T-shaped bus connectors according to the invention, each populated with a module, FIG. 7 a schematized third embodiment of a T-shaped bus connector according to the invention, FIG. 8 a schematized longitudinal section through the embodiment according to FIG. 7, FIG. 9 a schematized longitudinal section through an arrangement of two T-shaped bus connectors according to FIG. 7, each populated with a module.
Figure 2:
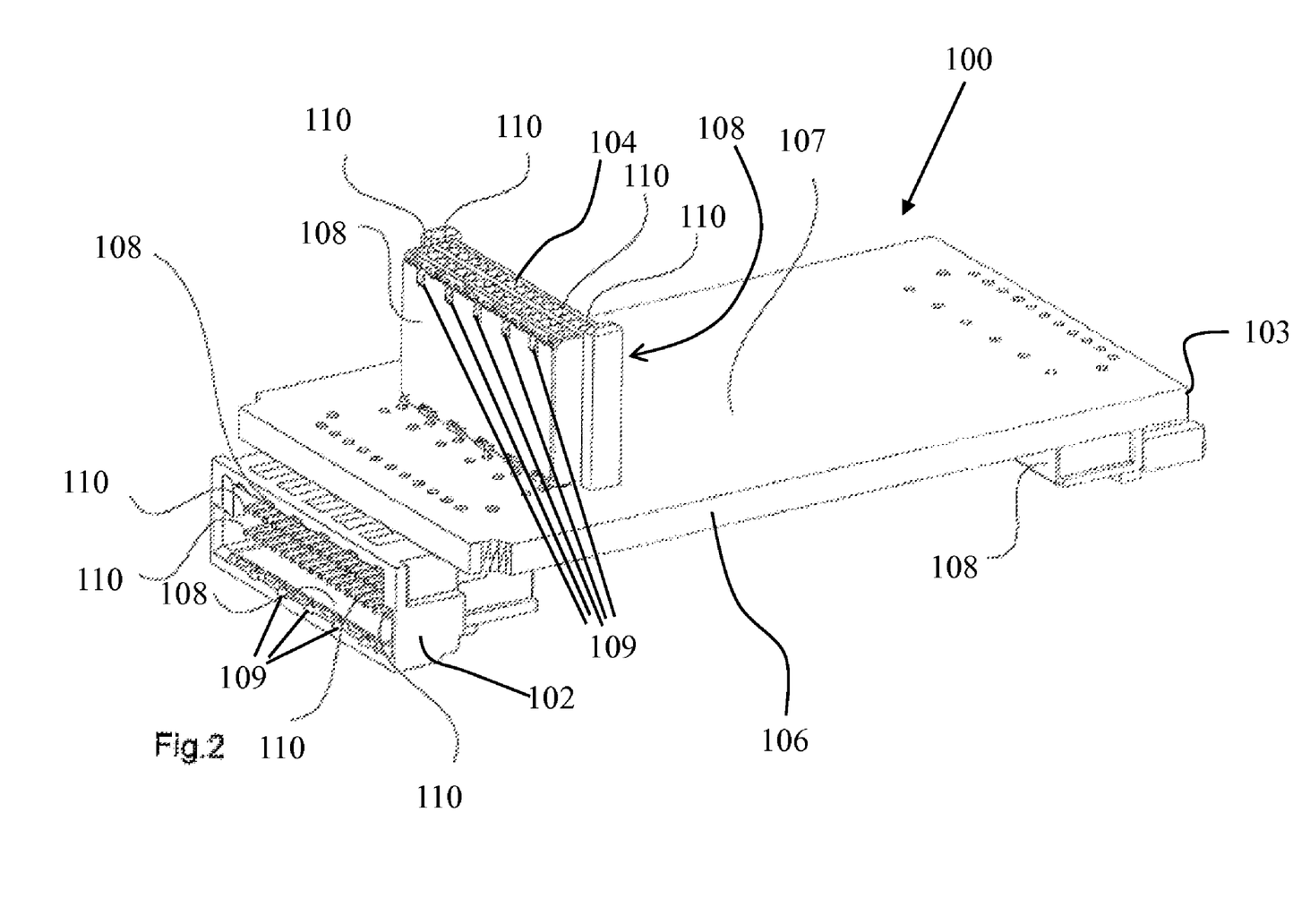
Figure 3:
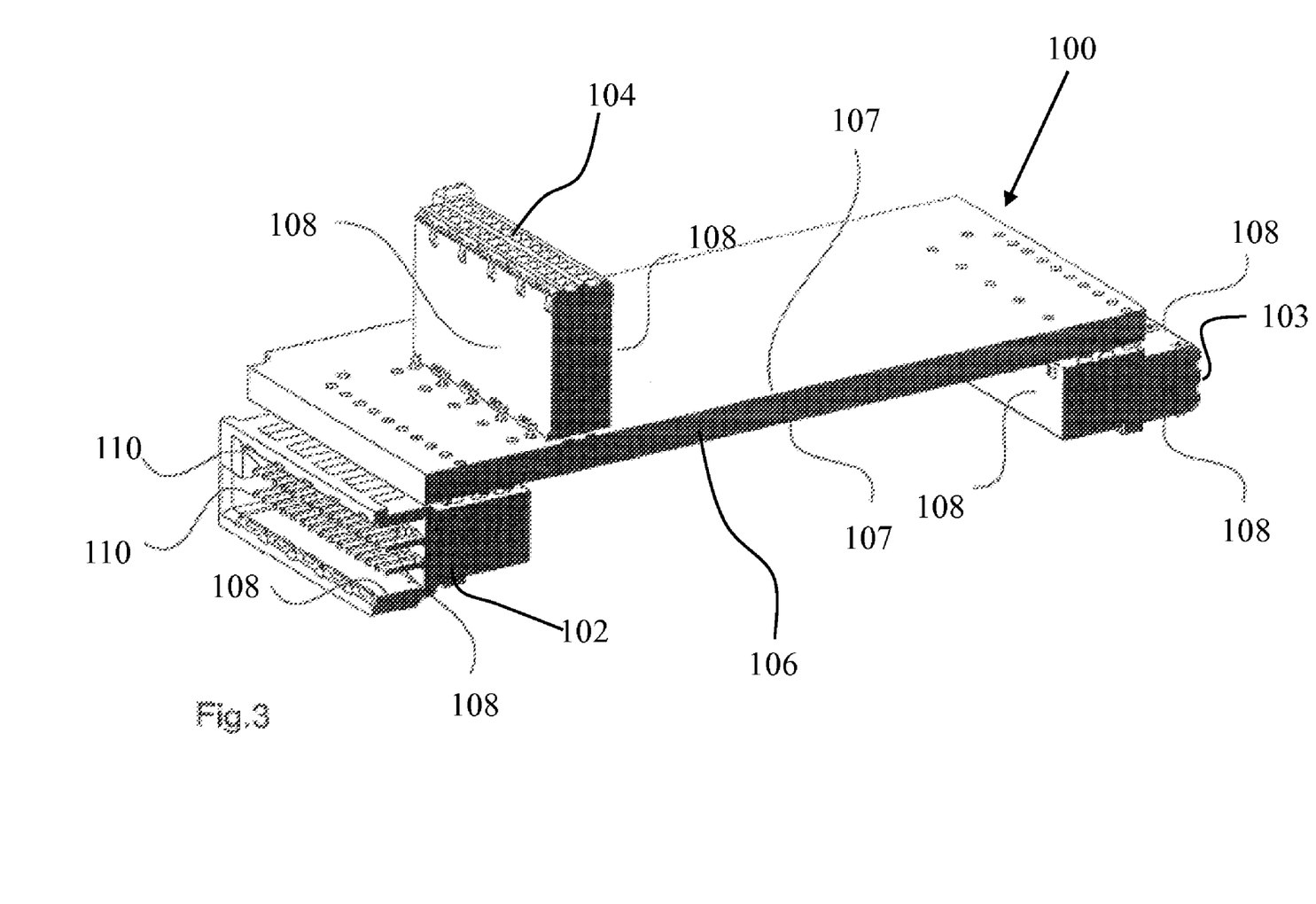

To increase electromagnetic compatibility, all three connecting units 102, 103 and 104 of the T-shaped bus connector 100 are at least partially surrounded by a shielding material in such a manner that, in a connection to a respective complementarily constructed connecting unit, the shielding material of each of these connecting units contacts a shielding material at least partially surrounding this complementary connecting unit. The connecting unit 205 of an electronic or electrical module 200 is consequently likewise covered in the preferred embodiment with a shielding material that contacts the shielding material at least partially surrounding connecting unit 104 when the two connecting units are brought together. The circuit board 106 is likewise shielded at least with respect to its two outer layers 107 (FIGS. 2, 3).

With regard to the provision and arrangement of corresponding shielding, several of the latter lying within the scope of the invention will be described below, likewise with reference to the figures, particularly FIGS. 2, 3, 7 and 8.

For the substantially rectangularly shaped pluggable connecting units 102, 103, 104 and 205 represented in the figures, it is provided according to a first preferred embodiment for the formation of the invented shielding that all three connecting units 102, 103 and 104 of the bus socket modules 100 are shielded at least on their two larger outer surfaces with a sheet metal shield, labeled in part 108 in the figures, and in this case the connecting unit 205 on the side of a module 200 facing the respective bus socket module 100 is expediently likewise shielded at least on the two larger outer surfaces completely with a sheet metal shield, labeled in part 208 in the figures. The shielding surfaces 108 and 208 of the plug connectors are designed such that, in the plugged-in state, they have many contacts with their counterpart a slight distance apart from one another over their entire length, i.e., along the transverse axis labeled A2 in FIG. 1. For this purpose, contact springs, as easily visible in FIG. 2, for instance, and labeled with the reference number 109, can be arranged on the sheet metal shield 108 and 208; they can alternatively be designed as bumps, pressed areas or the like. These shield surfaces 108 and 208 are each connected at least at one point to ground or to another suitable potential, e.g., a suitable potential of circuit board 106.

The shorter outer sides or smaller outer surfaces of the plug connectors 102, 103, 104 and 205 can likewise be furnished with shield surfaces in this case. Should this not be possible in a specific application, then according to an expedient alternative, a ground potential or another suitable potential can be applied to the outer pins of the plug connector, i.e., the pins arranged adjacent to the respective shorter outer side and labeled in part with the reference number 110 in FIGS. 2 and 3. In another alternative embodiment, inside pins can also be used for shielding, so long as the data signals are surrounded by ground pins.

In case a circuit board 106 is used in the bus modules, it is likewise completely shielded, as already mentioned, at least in the two outer layers 107 which provide the largest outside surfaces.

Figure 7:
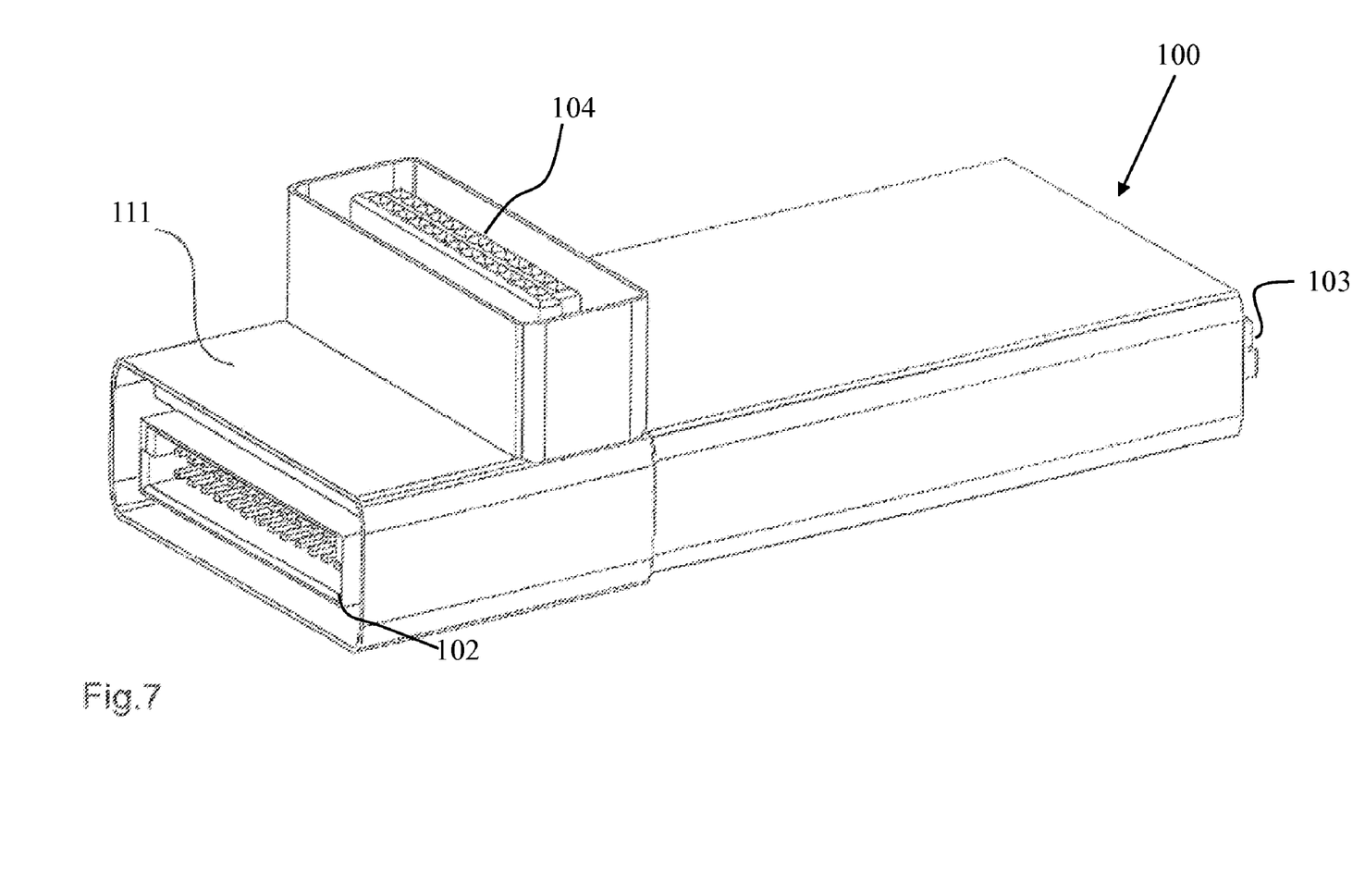
Figure 8:
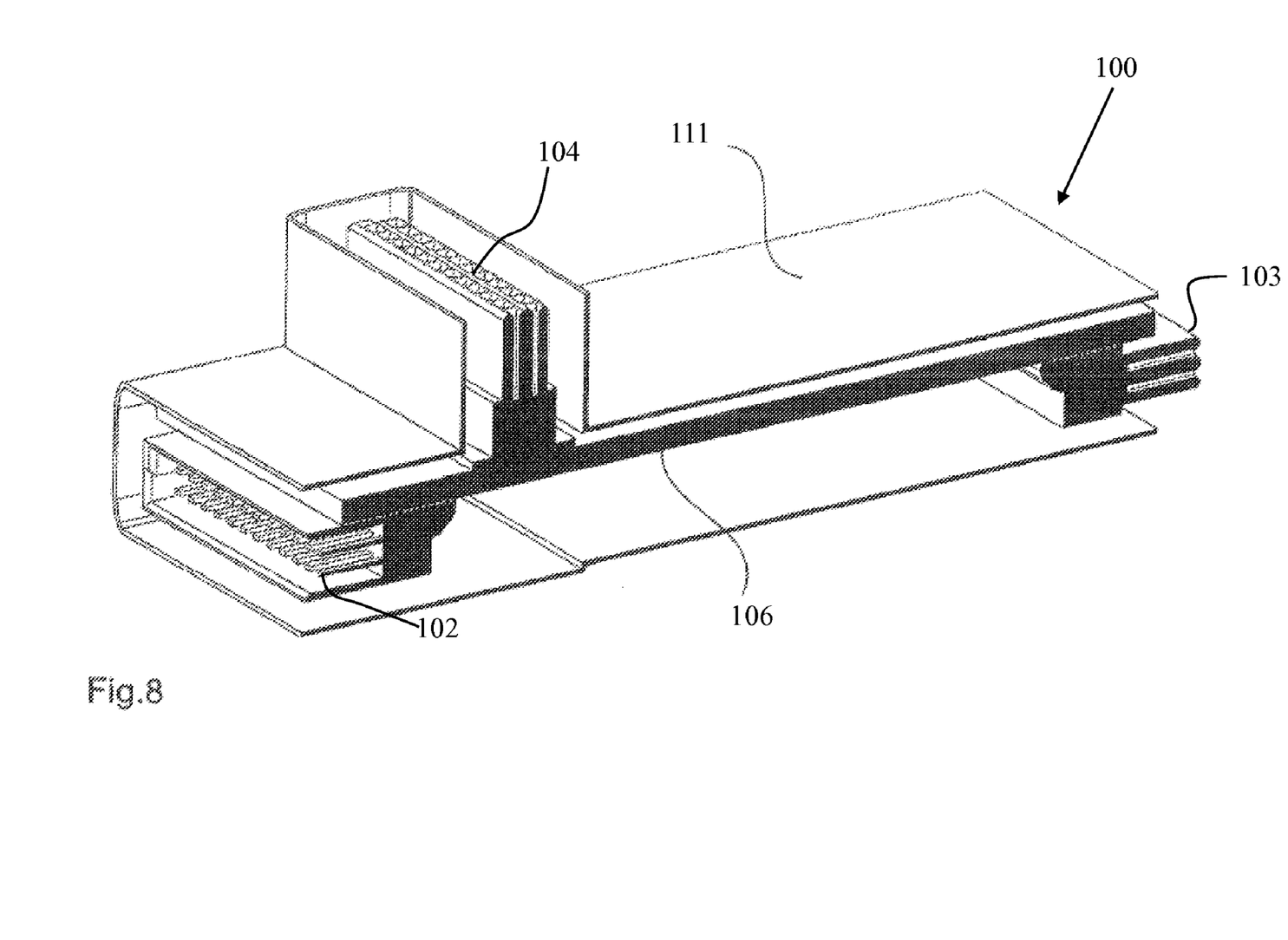

An additional preferred embodiment of the shielding is illustrated in FIGS. 7-9. In this embodiment, the shielding is produced by the fact that at least one electrically conductive housing part 111 surrounds the circuit board 106. The electrically conductive housing part 111 further encloses all three plug connectors 102, 103 and 104, and all around these plug connectors over their entire length it again has many contact points a slight distance away from one another that contact the conductive housing part 111 of the respective adjacent bus socket module 100 or a shield 211 surrounding the plug connector 205 on the back side of module 200, as can be seen in FIG. 9.

In additional application-specifically expedient embodiments, not illustrated in figures however, the shielding can be constructed in that at least one sheet metal shield originating from one side encloses the circuit board of a bus socket module, wherein the shield in such a sheet metal shield is then closed by an outside layer of the circuit board. The sheet metal shield of the bus socket module is again dimensioned around the plug connector in such a manner and again has contacts a slight distance apart from one another on the entire length around the plug connector in such a manner that the sheet metal shield of the first bus socket module contacts the respective sheet metal shields of adjacent second bus socket modules connected to the first bus socket module, and a sheet metal shield around the plug connector on the back side of a module connected to the first bus socket module.

According to an additional embodiment not illustrated in the figures, the shielding can be realized by housing the bus socket module in a plastic housing that is coated with metal in such a manner that the metallization circumferentially represents a shield and is again dimensioned around the plug connector in such a manner and has many contacts a slight distance apart over the entire length in such a manner that a metallization or a sheet metal shield around the plug connector on the back side of a module connected to the bus socket module is contacted by the metallization of an adjacent bus socket module.

Particularly for shielding configurations using housings or housing parts, it is also possible to use, alternatively and in place of a circuit board with plug connectors, an arrangement of conductors with contacts, as used in the bus connector design disclosed in EP 0 896 504, for instance.

Based on the shields described above as examples, it is as preferred according to the invention that the entire backplane bus constructed of the individual bus socket modules be circumferentially shielded.

For this purpose, the shielding surrounding a respective connecting unit at least in part is dimensioned around the respective connecting unit in a particularly expedient manner such that the shielding around each connecting unit is complementary to the shielding of a complementary connecting unit to be coupled to this connecting unit.

In the above-described embodiments, the shielding material of the respective shields can also be connected, for instance, to functional earth or to another free potential or to another potential that is connected to ground or functional earth, directly or via a resistor and/or a capacitor.

It is understood that the above-described characteristics can be used not only in the respectively indicated combination, but also in other combinations or alone, insofar as not otherwise indicated, without thereby departing from the scope of the present invention.

The invention claimed is:

1. T-shaped bus connector, comprising:
    a holding device for mechanically retaining the T-shaped bus connector on a mounting device on which the T-shaped bus connector is to be arranged;
    a first and a second connecting unit (102, 103) for respectively producing an electrical connection to a complementary connecting unit of a device arranged adjacent to the bus connector, wherein the first and second connecting units face in substantially opposing directions and are constructed complementarily to one another; and
    a third connecting unit (104), oriented substantially perpendicular to the first and second connecting units, for producing an electrical connection to a connecting unit (205), complementary to the third connecting unit, of an electrical or electronic module (200);
    wherein data and/or power bus lines are run between all three connecting units, all three connecting units of the T-shaped bus connector are covered at least in part with a shielding material, and the shielding material of each of the three connecting units can contact, in case of a connection of each connecting unit to a respective complementarily formed connecting unit, a shielding material at least partially covering this complementarily formed connecting unit.

2. T-shaped bus connector according to claim 1, wherein the shielding surrounding a respective connecting unit at least in part is dimensioned around the respective connecting unit such that the shielding around this connecting unit is complementary to the shielding of a respective complementary connecting unit to be coupled to this connecting unit.

3. T-shaped bus connector according to claim 1, wherein the shielding materials are shaped with a plurality of contact points that, upon connection to a connecting unit with a respective complementarily constructed shielding material, bring about mutual contacting in small intervals and substantially over the entire length between the two shielding materials.

4. T-shaped bus connector according to claim 1, wherein the first or second connecting unit is an electrically conductive male multipoint contact or female multipoint contact.

5. T-shaped bus connector according to claim 1, wherein the mounting unit is a mounting rail (300) and the retaining unit comprises at least two resilient catch hooks for movable and detachable retention of the connector on the mounting rail.

6. T-shaped bus connector according to claim 1, wherein all three connecting units are held in their positions by a circuit board, which additionally carries the data and/or power bus lines between all three connecting units.

7. T-shaped bus connector according to claim 6, wherein the bus lines of the circuit board provide data bus lines which, upon concatenation of a plurality of T-shaped bus connectors according to one of the preceding claims by means of connections via respective first and second connecting units, carry data signals between the first, second and third connecting units in such a manner that data signals carried via the data bus lines are respectively present at all third connecting units, at the third connecting units of a group of directly concatenated bus connectors, and at the third connecting units of two directly concatenated bus connectors and connect them in the form of a "daisy chain" and/or also bridge one or more third connecting units of bus connectors concatenated with one another.

8. T-shaped bus connector according to claim 1, wherein all three connecting units (102, 103, 104) are rectangular in shape and are completely shielded with a metal shield at least on the respective two larger outer surfaces.

9. T-shaped bus connector according to claim 1, wherein the shorter outer sides or smaller outer surface of all three connecting units are likewise furnished with shielding areas, or a ground potential or a suitable potential is applied to pins of the connecting unit that are arranged adjacent to the respective shorter outer side, or ground potential or a suitable potential is applied to inner pins of the connecting units that surround the pins for carrying data signals.

10. T-shaped bus connector according to claim 8, in which a circuit board comprised by the connector is completely shielded, at least with respect to the two outer layers.

11. T-shaped bus connector according to claim 1, wherein at least one electrically conductive housing part surrounds the bus connector, or the connector is housed in a plastic housing that is coated with metal, wherein the conductive housing part or the middle layer provides a circumferential shield for all three connecting units.

12. T-shaped bus connector according to claim 1, wherein at least one metal shield, starting from one side and closed by an outer surface of the circuit board, surrounds a circuit board comprised by the bus connector.

* * * * *